(12) United States Patent
David et al.

(10) Patent No.: US 11,988,776 B2
(45) Date of Patent: May 21, 2024

(54) OPTICAL LIGHT EMITTER DEVICE AND METHOD

(71) Applicant: STMicroelectronics (Alps) SAS, Grenoble (FR)

(72) Inventors: Romain David, Grenoble (FR); Xavier Branca, Sassenage (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 18/359,477

(22) Filed: Jul. 26, 2023

(65) Prior Publication Data

US 2023/0384429 A1 Nov. 30, 2023

Related U.S. Application Data

(63) Continuation of application No. 16/888,334, filed on May 29, 2020, now Pat. No. 11,754,684.

(30) Foreign Application Priority Data

Jun. 11, 2019 (FR) ........................ 1906197

(51) Int. Cl.
*G01S 7/484* (2006.01)
*G01S 17/10* (2020.01)
*H01S 5/042* (2006.01)
*H01S 5/062* (2006.01)

(52) U.S. Cl.
CPC ............. *G01S 7/484* (2013.01); *G01S 17/10* (2013.01); *H01S 5/0428* (2013.01); *H01S 5/062* (2013.01)

(58) Field of Classification Search
None
See application file for complete search history.

(56) References Cited

U.S. PATENT DOCUMENTS

| | | | |
|---|---|---|---|
| 6,697,402 B2 | 2/2004 | Crawford | |
| 7,439,945 B1 | 10/2008 | Awalt et al. | |
| 8,188,682 B2 | 5/2012 | Nalbant | |
| 8,803,437 B2 | 8/2014 | Hsieh | |
| 2005/0110474 A1* | 5/2005 | Ortiz | H02M 1/14 323/282 |
| 2009/0238226 A1* | 9/2009 | Moto | H01S 5/042 372/38.02 |
| 2014/0312233 A1 | 10/2014 | Mark et al. | |
| 2015/0130903 A1 | 5/2015 | Thompson et al. | |
| 2015/0308949 A1* | 10/2015 | Sadhu | G01J 1/46 315/246 |
| 2017/0365979 A1 | 12/2017 | Van der Tempel et al. | |
| 2018/0261975 A1 | 9/2018 | Pavlov et al. | |

FOREIGN PATENT DOCUMENTS

WO 2013007787 A1 1/2013

* cited by examiner

*Primary Examiner* — Tuan N Nguyen
(74) *Attorney, Agent, or Firm* — Slater Matsil, LLP

(57) ABSTRACT

The present disclosure relates to a driver circuit for an optical light emitter of a ranging device, the driver circuit comprising: an inductor having a first of its nodes coupled to a current driver; a first branch comprising a first switch coupled between the second node of the inductor and a first supply voltage rail; a second branch for conducting a current through the optical light emitter, the second branch being coupled between the second node of the inductor and the first supply voltage rail; and a current sensor configured to detect the current passing through the inductor and to provide a feedback signal to the current driver.

20 Claims, 3 Drawing Sheets

OPTICAL LIGHT EMITTER DEVICE AND METHOD

CROSS-REFERENCE TO RELATED APPLICATIONS

This application is a continuation of U.S. patent application Ser. No. 16/888,334, filed May 29, 2020, which claims the priority benefit of French Patent Application No. 19/06197, filed on Jun. 11, 2019, the contents of which applications are hereby incorporated herein by reference in their entirety to the maximum extent allowable by law.

TECHNICAL FIELD

The present disclosure relates generally to the field of time-of-flight (ToF) ranging devices, and in particular to a driver for an optical light emitter of a ToF ranging device.

BACKGROUND

The ability of time-of-flight (ToF) cameras based on SPADs (Single Photon Avalanche Detectors) to provide precise photon arrival times makes them popular candidates for light detection and ranging (LiDAR) sensors. Such ToF cameras generally comprise a laser diode such as a vertical cavity surface-emitting laser (VCSEL) that emits, into an image scene, optical pulses or an optical waveform, and an array of SPADs for detecting the return signal reflected off objects in the image scene. The time-of-flight of the optical pulses is then determined, allowing the distance to one or more objects to be estimated.

In the case of direct ToF (dToF), the time delay of each return pulse with respect to the corresponding transmitted pulse is estimated in order to determine the time-of-flight, which can be converted into a distance measurement.

In the case of indirect ToF (iToF), the phase of the returned waveform is compared with that of the transmitted waveform in order to estimate the time-of-flight, which is then converted into a distance measurement.

Laser diodes, such as VCSELs, are light emitting devices capable of emitting light with an intensity that depends on a level of current driven through them.

There is a technical problem in providing a circuit capable of driving, in a relative precise manner, a VCSEL or other type of light emitting device to generate a series of optical pulses of a relatively high intensity and short duration.

SUMMARY

According to one aspect, a driver circuit for an optical light emitter of a ranging device comprises an inductor having a first of its nodes coupled to a current driver, a first branch comprising a first switch coupled between the second node of the inductor and a first supply voltage rail, a second branch for conducting a current through the optical light emitter, the second branch being coupled between the second node of the inductor and the first supply voltage rail, and a current sensor configured to detect the current passing through the inductor and to provide a feedback signal to the current driver.

According to one embodiment, the current sensor is coupled between the current driver and the first node of the inductor.

According to one embodiment, the current sensor is provided in the first or second branch.

According to one embodiment, the driver circuit further comprises a control circuit configured to control the first switch with a timing signal at a first frequency, and the current driver comprises a second switch coupling the first node of the inductor to a second supply voltage rail, the second switch being controlled by a timing signal having a second frequency lower than the first frequency.

According to one embodiment, the second frequency is at least five times lower than the first frequency.

According to one embodiment, the current driver further comprises a third switch coupled in series with the second switch between the first and second supply voltage rails.

According to one embodiment, the current driver further comprises a pulse-width modulation circuit configured to control the second and third switches based on a comparison between the feedback signal and a reference signal.

According to a further aspect, a time-of-flight ranging device comprises an optical light emitter, the above driver circuit causing the optical light emitter to generate optical light pulses, and a pixel array configured to receive reflected optical light pulses from the image scene.

According to one embodiment, the optical light emitter is a laser diode, such as a vertical cavity surface-emitting laser.

According to a further aspect, a method of driving an optical light emitter of a ranging device comprises applying, by a current driver a current to a first node of an inductor, during a first phase, activating a first switch coupled in a first branch between the second node of the inductor and a first supply voltage rail during a second phase, passing the current through a second branch comprising the optical light emitter, the second branch being coupled between a second node of the inductor and the first supply voltage rail, and detecting, by a current sensor, the current passing through the inductor to provide a feedback signal to the current driver.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

Unless specified otherwise, the expressions "around", "approximately", "substantially" and "in the order of" signify within 10%, and preferably within 5%.

Figure 1:
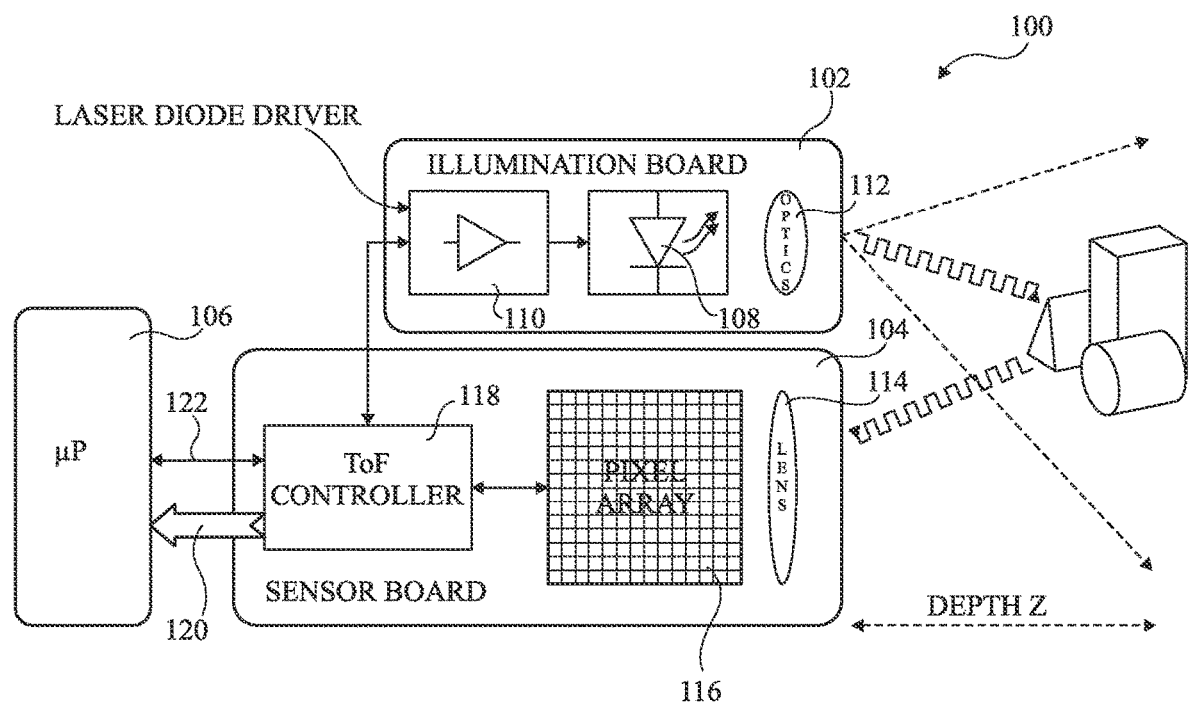
FIG. 1 schematically illustrates a ranging device according to an example embodiment.

FIG. 1 schematically illustrates a ranging device 100 according to an example embodiment of the present disclosure.

The ranging device 100 comprises an illumination circuit (ILLUMINATION BOARD) 102, a sensor circuit (SENSOR BOARD) 104 and a processing device (P) 106. In some embodiments, the circuits/device 102, 104 and 106 are formed by separate circuit boards, although in alternative embodiments they could all be mounted on a same circuit board.

The circuit 102 for example comprises an optical light emitter 108, which is for example a laser diode such as a VCSEL, and a driver circuit (LASER DIODE DRIVER) 110 for driving the optical light emitter 108. In some embodiments, the circuit 102 also comprises optics (OPTICS) 112 for modifying the light beam generated by the optical light emitter 108 prior to transmission into the image scene.

The sensor circuit 104 for example comprises one or more lenses (LENS) 114 for focusing light from the image scene onto pixels of a pixel array (PIXEL ARRAY) 116. The pixel array is for example coupled to a time-of-flight controller (ToF CONTROLLER) 118. The controller 118 is also for example coupled to the driver circuit 110, and to the processing device 106 via a data bus 120 and via one or more control lines 122.

In operation, a periodic optical signal comprising pulses is generated by the illumination circuit 102 and transmitted into the image scene.

In some embodiments, the periodic optical signal is a continuous waveform such as a square wave, and an indirect time-of-flight (iToF) technique is used. This for example involves determining, by the controller 118, a phase difference between transmitted signal and the return signal received by each pixel of the pixel array 116 in order to determine, for each pixel, the time-of-flight of the optical waveform.

In alternative embodiments, the periodic optical signal comprises optical pulses that are relatively spaced apart, and a direct time-of-flight (dToF) technique is used. This for example involves determining, by the controller 118, the time delay between the transmission of an optical pulse by the illumination circuit 102 and the reception of that optical pulse by each of the pixels of the pixel array 116. The steps are for example repeated for a sequence of tens, hundreds or even thousands of pulses in order to determine, for each pixel, the average time-of-flight of the optical pulses.

The controller 118 for example outputs, for each pixel of the pixel array, a distance measurement on the output bus 120 to the processing device 106.

Figure 2:
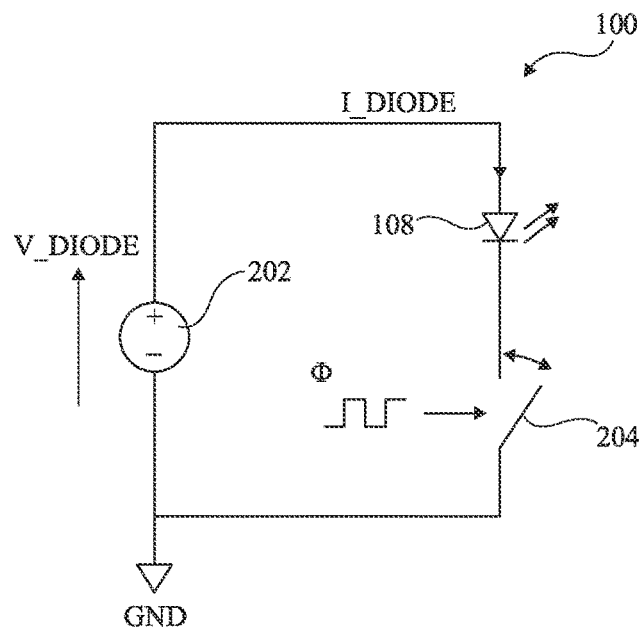
FIG. 2 is a circuit diagram of a laser diode driver circuit that has been proposed.

FIG. 2 illustrates the driver circuit 110 of the illumination sensor 102 of FIG. 1 according to a solution that has been proposed. A voltage source 202 is used to apply a potential V_DIODE across the series connection of the optical light emitter 108 and a switch 204. The switch 204 is controlled by a phase signal Φ in order to pass a current I_DIODE through the diode 108 and generate the periodic optical signal.

In a time-of-flight ranging device such as the device 100 of FIG. 1, the depth uncertainty σz has the following relation:

$$\sigma_z \propto \frac{1}{f} \cdot \frac{1}{\sqrt{P_{opt}}} \qquad \text{[Math 1]}$$

where f is the frequency of the periodic optical signal, and $P_{opt}$ is the transmitted optical power.

Therefore, it would be desirable to increase the frequency and/or the transmitted optical power in order to improve the depth uncertainty. However, there is a technical difficulty in generating a relatively high current having pulses of relatively short-duration and high frequency in view of parasitic inductances, capacitances and resistances present in passive components, packages and interconnections. Indeed, in the circuit of FIG. 2, the current will have a relatively slow rise time due at least in part to parasitic inductances. Not only does this mean that it can be difficult to obtain a relatively high frequency pulse of relatively high amplitude, but also, the pulse is likely to have a non-uniform amplitude. This means that while the average power of the pulse may correspond to a desired level, the peak current may result in exceeding the desired power during part of the pulse, which may in turn cause laser safety limits to be exceeded. A further drawback of the solution of FIG. 2 is that the voltage V_DIODE should be relatively high in order to create pulses of relatively high amplitude.

Figure 3:
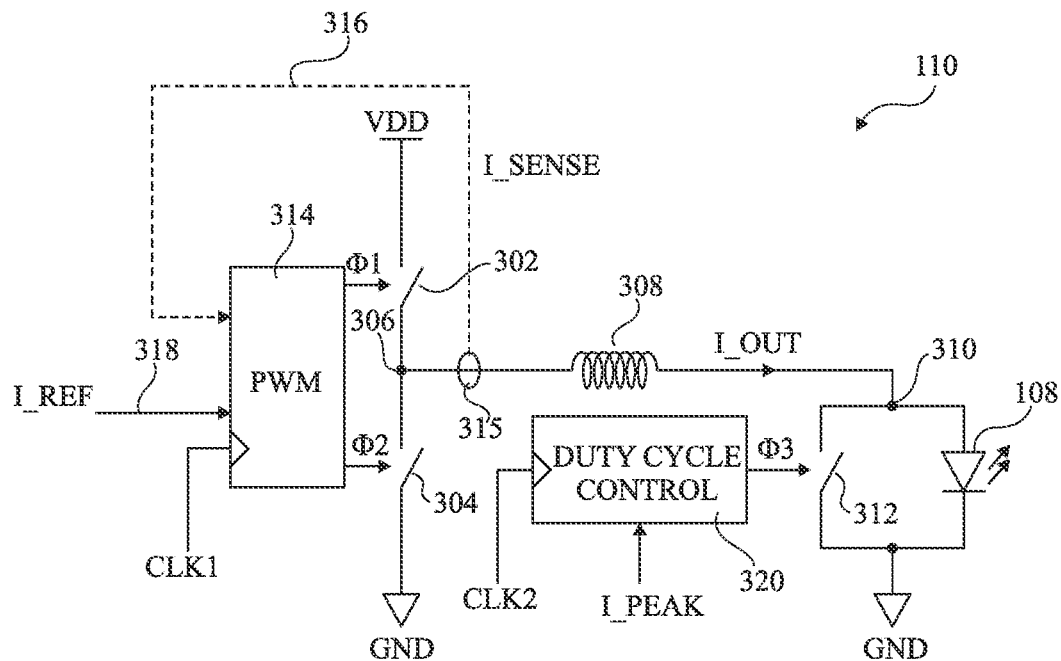
FIG. 3 is a circuit diagram of a driver circuit for an optical light emitter according to an example embodiment of the present disclosure.

FIG. 3 schematically illustrates the driver circuit 110 of FIG. 1 in more detail according to the example embodiment of the present disclosure.

The circuit 110 of FIG. 3 comprises the series connection of switches 302 and 304 between high and low supply voltage rails VDD, GND of the circuit. An intermediate node 306 between the switches 302, 304 is coupled via an inductor 308 to a further node 310. The node 310 is for example coupled to a ground rail GND via two separate branches. One branch comprises the optical light emitter 108, which in the example of FIG. 3 is represented by a laser diode. The other branch comprises a switch 312.

The switches 302 and 304 are controlled respectively by phase signals Φ1 and Φ2, which are for example generated by a pulse-width modulation (PWM) circuit 314. The PWM circuit 314 and switches 302, 304 form a current driver for driving current through the inductor 308. In some embodiments, the switches 302 and 304, circuit 314 and inductor 308 together form a current-mode buck converter, but without an output capacitor.

A current sensor 315 is for example positioned so as to detect the current passing, at least some of the time, through the inductor 308, and provide the measured current I_SENSE on a feedback line 316 to an input of the PWM circuit 314. The PWM circuit 314 for example compares the detected current I_SENSE with a reference current I_REF provided on an input line 318, and adjusts the duty cycle of the phase signals Φ1 and Φ2 in order to bring the generated current represented by the signal I_SENSE to the level of the reference current I_REF.

The switch 312 is controlled by a phase signal Φ3, which is for example generated by a duty cycle control circuit (DUTY CYCLE CONTROL) 320, based on a desired peak current I_PEAK.

The PWM circuit 314 for example generates the phase signals Φ1 and Φ2 based on a clock signal CLK1 having a frequency FLOW. The duty cycle control circuit 320 for example generates the phase signal Φ3 based on a clock signal CLK2 having a frequency F_HIGH.

The frequency F_HIGH is for example higher than the frequency FLOW and in some embodiments at least five times higher, or even ten times higher. This means that the period of each of the phase signals Φ1 and Φ2 is for example at least five or ten times higher than the period of the phase signal Φ3.

In some embodiments, the frequency FLOW is in the range 2 to 10 MHz, and the frequency F_HIGH is in the range 50 to 200 MHz.

Operation of the circuit of FIG. 3 will now be described in more detail with reference to FIG. 4.

Figure 4:
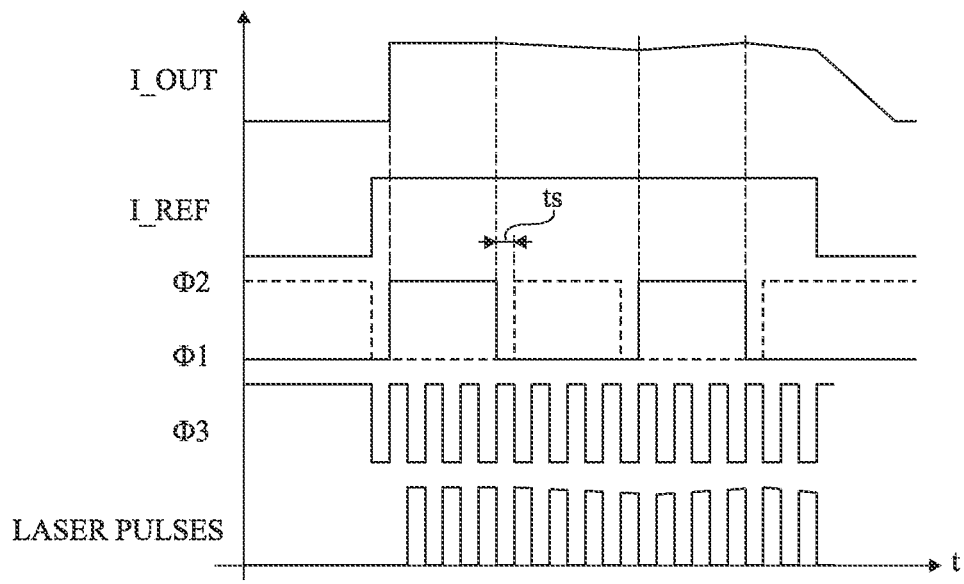
FIG. 4 is a timing diagram illustrating examples of signals in the driver circuit of FIG. 3.

FIG. 4 is a timing diagram illustrating examples of the signals I_OUT generated by the inductor 308, I_REF, Φ1 (solid line), Φ2 (dashed line) and Φ3 of the circuit 110 of FIG. 3, and also the resulting form of the laser pulses (LASER PULSES) generated by the optical light emitter.

In an initial state shown in FIG. 4, the inductor 308 is initially discharged, the switch 302 is non-conducting, and the switches 304 and 312 are conducting. Thus, the current I_OUT is at zero or close to zero, and there are no optical pulses.

The reference current I_REF is then activated, and the phase signals Φ1 and Φ2 alternate between high and low levels in order to turn on and off the switches 302 and 304 in an alternating manner, one switch being activated at a time while the other switch is non-conducting. Thus, the switches 302 and 304 are never both activated at the same time. In some embodiments, the high pulses of the signals Φ1 and Φ2 are separated by a time interval ts during which both of the signals Φ1 and Φ2 are low. In some embodiments, the duty cycle of the phase signal Φ1 is between 40% and 60%, and the duty cycle of the phase signal Φ2 is between 40% and 60%.

The phase signals Φ1 and Φ2 for example continue to alternate throughout the optical pulse transmission period during which the optical light emitter is to be controlled to generate the optical pulses, corresponding for example to the period that the reference current I_REF is active. The current I_OUT therefore starts to conduct soon after the first rising edge of the phase signal Φ1, and continues throughout the period that the reference current I_REF is active.

The phase signal Φ3 also for example alternates between high and low levels throughout optical pulse transmission period. However, this alternation occurs at a higher frequency than the frequency at which the phase signals Φ1 and Φ2 alternate between the high and low states.

At the end of the optical pulse transmission period, the phase signals Φ2 and Φ3 go/remain high, and the reference current I_REF and phase signal Φ1 go/remain low, causing the current I_OUT to fall to zero relatively quickly.

The inductor 308 maintains the current I_OUT at a relatively stable level while the phase signals Φ1 and Φ2 alternate, with for example a relatively small ripple represented in FIG. 4 during the high and low cycles of the phase signal Φ1. Thus, the optical pulses also have relatively constant amplitudes.

Figure 5:
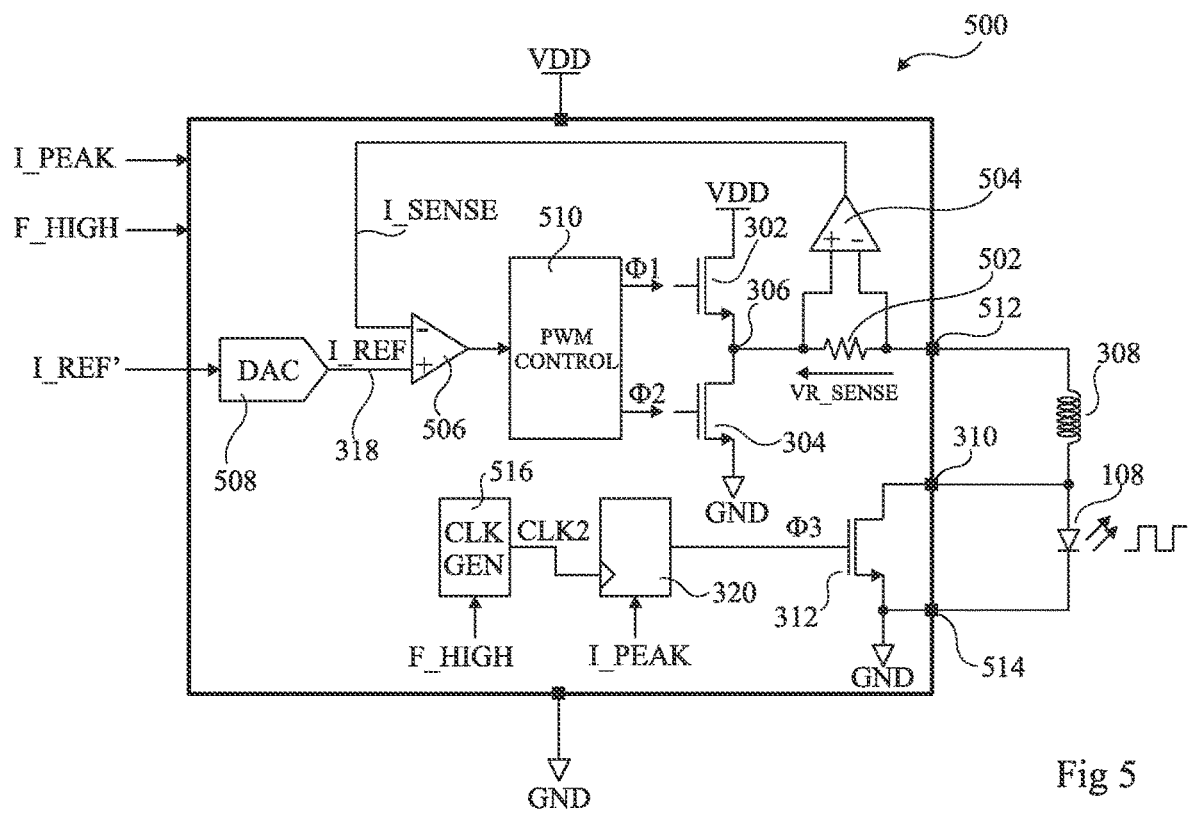
FIG. 5 is a circuit diagram illustrating a first example implementation of the driver circuit of FIG. 3.

FIG. 5 schematically illustrates an example implementation 500 of the driver circuit 110 of FIG. 3. In the example of FIG. 5, the current sensor 315 is implemented by a resistor 502 coupled between the node 306 and the inductor 308. The nodes of the resistor 502 are for example coupled to a differential amplifier 504, which amplifies the voltage drop VR_SENSE across the resistor 502 to generate the feedback signal I_SENSE in the form of an analog voltage.

The feedback signal I_SENSE is provided to the negative input of a comparator 506. A digital to analogue converter (DAC) 508 for example generates the reference current I_REF on the line 318 in the form of an analog voltage level based on a digital input I_REF'. The signal I_REF is for example provided to a positive input of the comparator 506, the output of which is provided to a PWM control circuit (PWM CONTROL) 510. For example, the comparator 506 and PWM control circuit 510 together implement the PWM circuit 314 of FIG. 3.

In the embodiment of FIG. 5, the switches 302, 304 and 312 are implemented by n-channel MOS transistors.

Furthermore, in the embodiment of FIG. 5, the inductor 308 and the optical light emitter 108 are mounted off chip, a pin 512 coupling one node of the sense resistor 502 to one terminal of the inductor 308, the node 310 forming another pin coupled to the other node of the inductor 308 and to the anode of the laser diode implementing the optical light emitter 108, and a pin 514 coupling the cathode of the laser diode 108 to the ground supply rail GND.

The integrated circuit of FIG. 5 also for example comprises a clock generator (CLK GEN) 516 that generates the clock signal CLK2 to the duty cycle control circuit 320 based on an input F_HIGH, which is for example a digital value setting the frequency F_HIGH.

Figure 6:
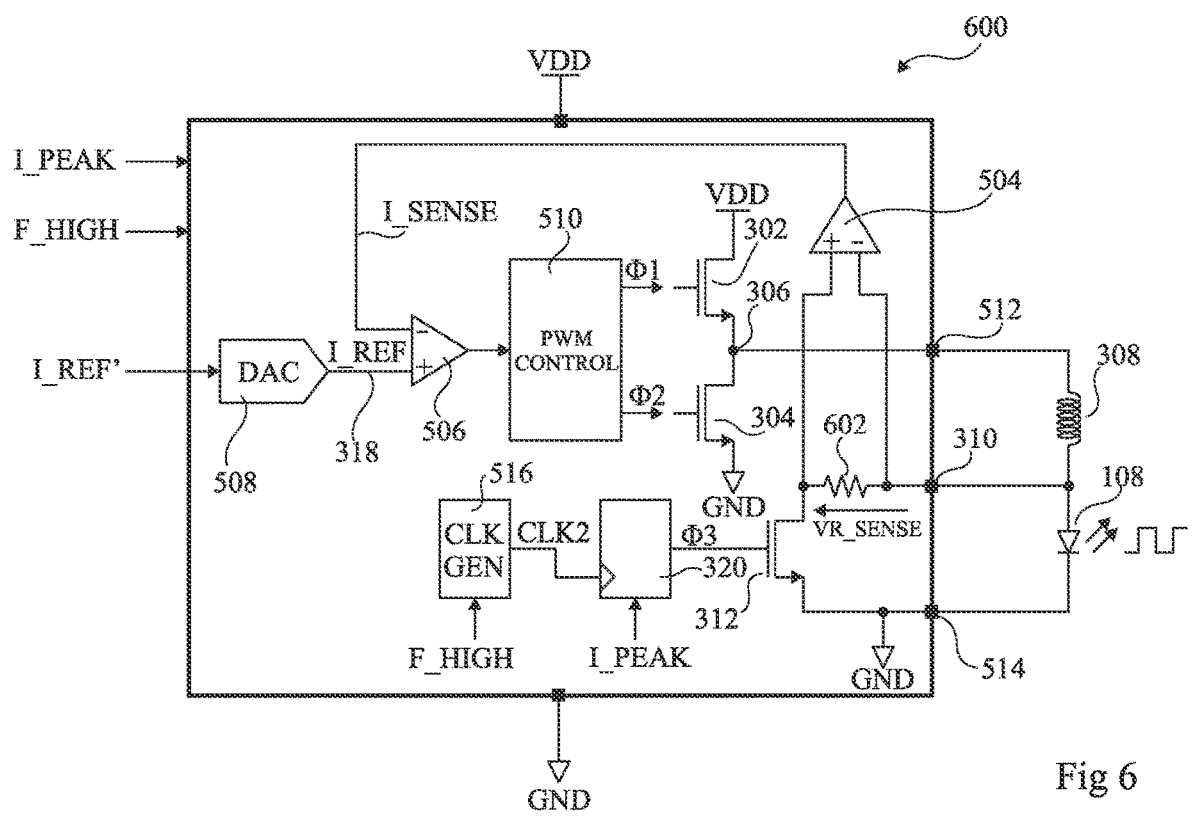
FIG. 6 is a circuit diagram illustrating a second example implementation of the driver circuit of FIG. 3.

FIG. 6 schematically illustrates an example implementation 600 of the driver circuit 110 of FIG. 3 according to an alternative implementation to that of FIG. 5. The implementation 600 is the same as the implementation 500 of FIG. 5, except that the current sense resistor 502 is replaced by a current sense resistor 602 coupled in the branch comprising the switch 312, and coupled in particular between the node 310 and the switch 312. It will be noted that the current flowing through this branch is present only when the phase signal Φ3 is asserted, and thus the regulation is for example based on the average current. As such, the reference current I_REF for example corresponds to a fraction a of the desired peak current, where a is the duty cycle of the phase signal Φ3.

An advantage of the embodiments described herein is that optical pulses having relatively high and uniform power can be generated. Furthermore, the supply voltage can be relatively low, as for a given peak voltage, the supply rail VDD can be at only around half the peak voltage.

Furthermore, an advantage of placing the current sensor 315 between the node 306 and the inductor 308 is that the current can be regulated based on a desired peak current of each current pulse, independently of the duty cycle of the phase signal Φ3.

Various embodiments and variants have been described. Those skilled in the art will understand that certain features of these embodiments can be combined and other variants will readily occur to those skilled in the art. For example, while FIGS. 5 and 6 provide two examples of the positions of the current sensor, other positions would be possible, such as in the branch of the optical light emitter 108, or in the path coupling each of the branches comprising the light emitter 108 and switch 312 to ground.

Furthermore, it will be apparent to those skilled in the art that the ground voltage supply rail at 0 V could be replaced in alternative embodiments by a voltage supply rail at a different voltage level, which could be negative.

Finally, the practical implementation of the embodiments and variants described herein is within the capabilities of those skilled in the art based on the functional description provided hereinabove. In particular, possible implementations of the sensor circuit 116 will be well known to those skilled in the art, and have not been described in detail.

What is claimed is:

1. A driver circuit for an optical light emitter of a ranging device, the driver circuit comprising:
a first node configured to be coupled to a first terminal of an inductor;
a second node coupled to a first supply voltage rail and configured to be coupled to a cathode of the optical light emitter;
a third node configured to be coupled to a second terminal of the inductor and an anode of the optical light emitter;
a first switch having a conduction path coupled between the third node and the second node;
a duty cycle control circuit coupled to a control terminal of the first switch;
a resistor coupled between the first node and a current driver;
the current driver, having a reference current input; and
a differential amplifier having first and second voltage sense inputs coupled across the resistor, and a current sense output coupled to a second input of the current driver.

2. The driver circuit of claim 1, wherein the driver circuit is an integrated circuit.

3. The driver circuit of claim 1, wherein the current driver further comprises:
a second switch coupling the resistor to a second supply voltage rail; and
a third switch coupling the resistor to the first supply voltage rail.

4. The driver circuit of claim 3, wherein the current driver further comprises a pulse-width modulation circuit configured to control the second and third switches based on a comparison between the current sense output and the reference current input.

5. The driver circuit of claim 3, wherein the first, second, and third switches are n-channel metal-oxide-semiconductor transistors.

6. The driver circuit of claim 3, wherein the duty cycle control circuit is configured to control the first switch with a first timing signal at a first frequency.

7. The driver circuit of claim 6, wherein the current driver is configured to control the second switch with a second timing signal having a second frequency lower than the first frequency.

8. The driver circuit of claim 7, wherein the second frequency is at least five times lower than the first frequency.

9. A driver circuit for an optical light emitter of a ranging device, the driver circuit comprising:
a first node coupled to a current driver and configured to be coupled to a first terminal of an inductor;
a second node coupled to a first supply voltage rail and configured to be coupled to a cathode of the optical light emitter;
a third node configured to be coupled to a second terminal of the inductor and an anode of the optical light emitter;
a resistor having a first terminal coupled to the third node;
a first switch having a conduction path coupled between a second terminal of the resistor and the second node;
a duty cycle control circuit coupled to a control terminal of the first switch;
the current driver, having a reference current input; and
a differential amplifier having first and second voltage sense inputs coupled across the resistor, and a current sense output coupled to a second input of the current driver.

10. The driver circuit of claim 9, wherein the driver circuit is an integrated circuit.

11. The driver circuit of claim 9, wherein the current driver further comprises:
a second switch coupling the first node to a second supply voltage rail; and
a third switch coupling the first node to the first supply voltage rail.

12. The driver circuit of claim 11, wherein the current driver further comprises a pulse-width modulation circuit configured to control the second and third switches based on a comparison between the current sense output and the reference current input.

13. The driver circuit of claim 11, wherein the first, second, and third switches are n-channel metal-oxide-semiconductor transistors.

14. The driver circuit of claim 11, wherein the duty cycle control circuit is configured to control the first switch with a first timing signal at a first frequency.

15. The driver circuit of claim 14, wherein the current driver is configured to control the second switch with a second timing signal having a second frequency lower than the first frequency.

16. The driver circuit of claim 15, wherein the second frequency is at least five times lower than the first frequency.

17. A device comprising:
an inductor having a first node coupled to a current driver;
a first switch coupled between a second node of the inductor and a first supply voltage rail;
an optical light emitter coupled between the second node of the inductor and the first supply voltage rail;
a current sensor configured to detect a current passing through the inductor and to provide a feedback signal to the current driver, wherein the current sensor is coupled between the current driver and the first node of the inductor; and
the current driver, comprising:
a second switch coupling the first node of the inductor to a second supply voltage rail;
a third switch coupled in series with the second switch between the first and second supply voltage rails; and
a pulse-width modulation circuit configured to control the second and third switches based on a comparison between the feedback signal and a reference signal.

18. The device of claim 17, further comprising a duty cycle control circuit coupled to a control terminal of the first switch, wherein the duty cycle control circuit is configured to control the first switch with a first timing signal at a first frequency; and
wherein the second switch is controlled by a second timing signal having a second frequency lower than the first frequency.

19. The device of claim 18, wherein the second frequency is at least five times lower than the first frequency.

20. The device of claim 17, wherein the optical light emitter is a laser diode or a vertical cavity surface-emitting laser.

* * * * *